United States Patent [19]

Edwards et al.

[11] Patent Number: 4,729,056
[45] Date of Patent: Mar. 1, 1988

[54] SOLENOID DRIVER CONTROL CIRCUIT WITH INITIAL BOOST VOLTAGE

[75] Inventors: Arthur J. Edwards, Hoffman Estates, Ill.; Randall C. Gray, Tempe, Ariz.

[73] Assignee: Motorola, Inc., Schaumburg, Ill.

[21] Appl. No.: 914,702

[22] Filed: Oct. 2, 1986

[51] Int. Cl.$^4$ .............................. H01H 47/32
[52] U.S. Cl. .................... 361/153; 361/154; 361/194
[58] Field of Search ....... 361/152, 153, 154, 155, 194

[56] References Cited

U.S. PATENT DOCUMENTS

| | | | |
|---|---|---|---|
| 4,112,477 | 9/1978 | Sherwin | 361/155 |
| 4,300,508 | 11/1981 | Streit et al. | 361/154 |
| 4,338,651 | 7/1982 | Henrich | 361/154 |
| 4,417,201 | 11/1983 | Reddy | 123/490 |
| 4,479,161 | 10/1984 | Henrich et al. | 361/154 |
| 4,486,703 | 12/1984 | Henrich | 323/222 |
| 4,605,983 | 8/1986 | Harvey | 361/154 |

*Primary Examiner*—L. T. Hix
*Assistant Examiner*—David Porterfield
*Attorney, Agent, or Firm*—Phillip H. Melamed

[57] ABSTRACT

An improved solenoid driver control circuit is disclosed in which solenoid current is sensed and provided as an input to a comparator means comprising two separate comparators (24, 25). The comparator means receives a solenoid current sense signal (45) and maximum and minimum reference threshold levels which determine maximum and minimum current limits ($I_{max}$, $I_{min}$; $H_{max}$, $H_{min}$) for solenoid current during initial pull-in excitation and subsequent hold excitation. Pull-in time ($T_1$) is defined by a monostable multivibrator (33) reacting to a control pulse (41) to produce a predetermined pull-in time pulse (43) such that the pull-in time is independent of sensed solenoid current. During pull-in time a boost driver switch (53) applies high boost voltage to a power source terminal (16) which supplies solenoid current, and in response to achieving the maximum pull-in current limit ($I_{max}$) lower battery voltage is provided at the power source terminal. If the maximum pull-in current limit does not occur within a predetermined time ($t_{b1}$) after pull-in initiation (at $t_0$), then the lower battery voltage is applied to the power source terminal at that time. The above configuration insures rapid initial solenoid response while minimizing power dissipation and circuit stress.

21 Claims, 3 Drawing Figures

SOLENOID DRIVER CONTROL CIRCUIT WITH INITIAL BOOST VOLTAGE

CROSS REFERENCE TO RELATED APPLICATIONS

The present invention is related to the invention described in copending U.S. patent application Ser. No. 911,946 filed Sept. 26, 1986, entitled "Dual Limit Solenoid Driver Control Circuit," by Adelore F. Petrie, Thomas Karlmann, Steven Parmelee and Arthur J. Edwards, having the same assignee as the present invention.

BACKGROUND OF THE INVENTION

The present invention is related to inductor current controllers, and more specifically to solenoid current controllers.

It is generally desirable to implement actuation of a solenoid by providing an initial or pull-in period of time during which a maximum first current is effectively passed through the solenoid inductor to achieve initial actuation of the solenoid. Subsequently, a smaller magnitude solenoid current is implemented so as to maintain actuation of the solenoid wherein this occurs during a subsequent holding or hold period of time. In this manner, the efficiency of the solenoid controller is increased since only the minimum necessary holding current is utilized by the solenoid for maintaining solenoid actuation whereas a high pull-in or actuation current is initially permitted to insure the rapid response of the solenoid to a solenoid actuation control pulse.

Many prior circuits have implemented the general features of the solenoid current control system discussed above. Some of these systems determine the pull-in time, during which a high value of solenoid current can be drawn, by use of a monostable multivibrator. These systems typically utilize additional monostable multivibrators for implementing cycling of the solenoid current about a first high effective current pull-in level and then about a low holding current level. This cycling is implemented by essentially opening and closing the connection between the solenoid coil and a power supply. During the pull-in period solenoid current varies between maximum and minimum initial (pull-in) high current levels, and during the holding current period solenoid current varies between maximum and minimum lower holding current levels. The above referred-to copending U.S. application describes a similar system except direct control of the maximum/minimum current levels of the solenoid current is implemented by the use of separate maximum and minimum comparators which receive separate pull-in and hold thresholds during the pull-in and hold times, respectively. This results in more accurately controlling the magnitude of solenoid current.

In some prior systems, in addition to implementing a high maximum solenoid current during the pull-in period, to insure rapid turn-on of the solenoid in response to a control pulse, a high boost voltage has been applied across the solenoid during the pull-in period. This speeds up the initial actuation of the solenoid since this boost voltage is typically substantially higher than the normal voltage applied across the solenoid during the hold period of time. Typically, an auxiliary high voltage supply is initially applied across the solenoid during the pull-in period, and this is commonly termed the "boost" power supply. Previous implementation of applying a high voltage boost supply to the solenoid involved applying the boost voltage for the entire pull-in period. This is undesirable as it causes high voltage stress on the current switching elements that control solenoid current and the components in the boost voltage generator. In addition, this previous circuit design also reduces the time available for the boost voltage generator to recover between sequential pull-in times so that a high boost voltage is available for each sequential pull-in period. This is very important when the solenoid comprises a fuel injection solenoid and the engine into which the fuel is injected is operating at high speeds, thus requiring a rapid sequence of pull-in times.

SUMMARY OF THE PRESENT INVENTION

An object of the present invention is to provide an improved solenoid driver control circuit which overcomes the above-noted deficiencies of prior circuits.

In one embodiment of the present invention, an improved solenoid driver control circuit is provided. The control circuit comprises: a control signal input terminal for receiving a control signal; current sense means for providing a current sense signal indicative of current flowing through a solenoid; solenoid driver means having a first operable state such that current can flow through said solenoid from a power source terminal and a second operable state such that current effectively cannot flow from said power source terminal through said solenoid; threshold comparator means for comparing at least one received reference threshold input signal with said current sense signal and for providing an output signal in response thereto to control said solenoid driver means and implement at least maximum limits for said solenoid current; pull-in current means for responding to said control signal by initially providing, for an initial pull-in period of time, at least a predetermined maximum first reference threshold to said comparator means corresponding to a maximum current limit for said solenoid current during said pull-in period of time; holding current means for providing, for a hold time after said pull-in period of time, at least a predetermined maximum second reference threshold to said comparator means corresponding to a maximum current limit for said solenoid current during said hold time, said hold maximum current limit being lower than said pull-in maximum current limit; battery circuit means for connection between a battery and said power source terminal to selectively provide a nominal voltage at said power source terminal; and boost means coupled to said power source terminal to selectively provide a boost voltage substantially in excess of said nominal voltage at said power source terminal; wherein the improvement comprises boost control means coupled to said boost means and said threshold comparator means for providing said boost voltage to said power source terminal during said pull-in period until said pull-in maximum current limit occurs, said nominal voltage then being provided to said power source terminal during a remaining portion of said pull-in time.

In accordance with the above-stated embodiment of the present invention, application of the substantially higher boost voltage is removed as soon as the solenoid current flow reaches a first maximum pull-in current limit. During the remaining portion of the pull-in time, the maximum solenoid pull-in current limit is still maintained, but now the lower nominal voltage provided by the battery circuit means is applied across the solenoid.

Typically, only 200 microseconds are required for the solenoid of a fuel injector to reach its maximum pull-in current limit. Thus in the present invention the rest of the pull-in period and all of the hold period is available for the boost voltage generator to recharge itself.

According to another aspect of the present invention, application of the boost voltage is terminated during the pull-in time at a predetermined time after initiation of the pull-in period, but before termination of the pull-in period. This feature is preferably implemented by an additional boost control means such that in case a maximum pull-in current limit is not achieved within a predetermined time, then application of the boost voltage is terminated. In this case, since a maximum solenoid current limit was not achieved within a relatively short period of time, such as 400 microseconds, there is probably a failure of the boost voltage supply which can, therefore, be compensated for by providing additional subsequent time for the boost voltage supply to recover. This is implemented by insuring that boost voltage is applied for no more than a predetermined time even though this is less than the pull-in time.

Essentially, the present invention involves terminating the boost voltage supply during the pull-in period in response to either the occurrence of a predetermined maximum solenoid current limit during the pull-in time or the expiration of a predetermined time after the initiation of the pull-in period. In either event, additional time is provided prior to the next application of boost voltage so as to allow the boost voltage generator time to regenerate the substantially high boost voltage to be used. In addition, both of these features minimize the amount of time that current switching elements are subjected to the substantially higher boost voltage, and, therefore, the reliability of the present circuit is improved. While either of the above-stated features can be utilized individually to achieve improved performance, preferably both of these features are combined together such that boost voltage application will be terminated in response to either the achievement of the initial maximum current limit provided for during the pull-in period, or if this does not occur, then at a predetermined time after initiation of the pull-in period but still during and prior to the termination of the pull-in period. Implementation of these features is effectively provided by a flip flop circuit which is set to apply the boost voltage in response to the leading edge of a fuel injector input pulse. The flip flop is effectively reset to terminate the boost voltage either by the output of a comparator monitoring the solenoid current detecting that a maximum solenoid pull-in current has been achieved, or the output of a monostable timing circuit indicating that a predetermined period of time has elapsed.

BRIEF DESCRIPTION OF THE DRAWINGS

For a more complete understanding of the present invention, reference should be made to the drawings in which.

DESCRIPTION OF THE PREFERRED EMBODIMENT

Figure 1:
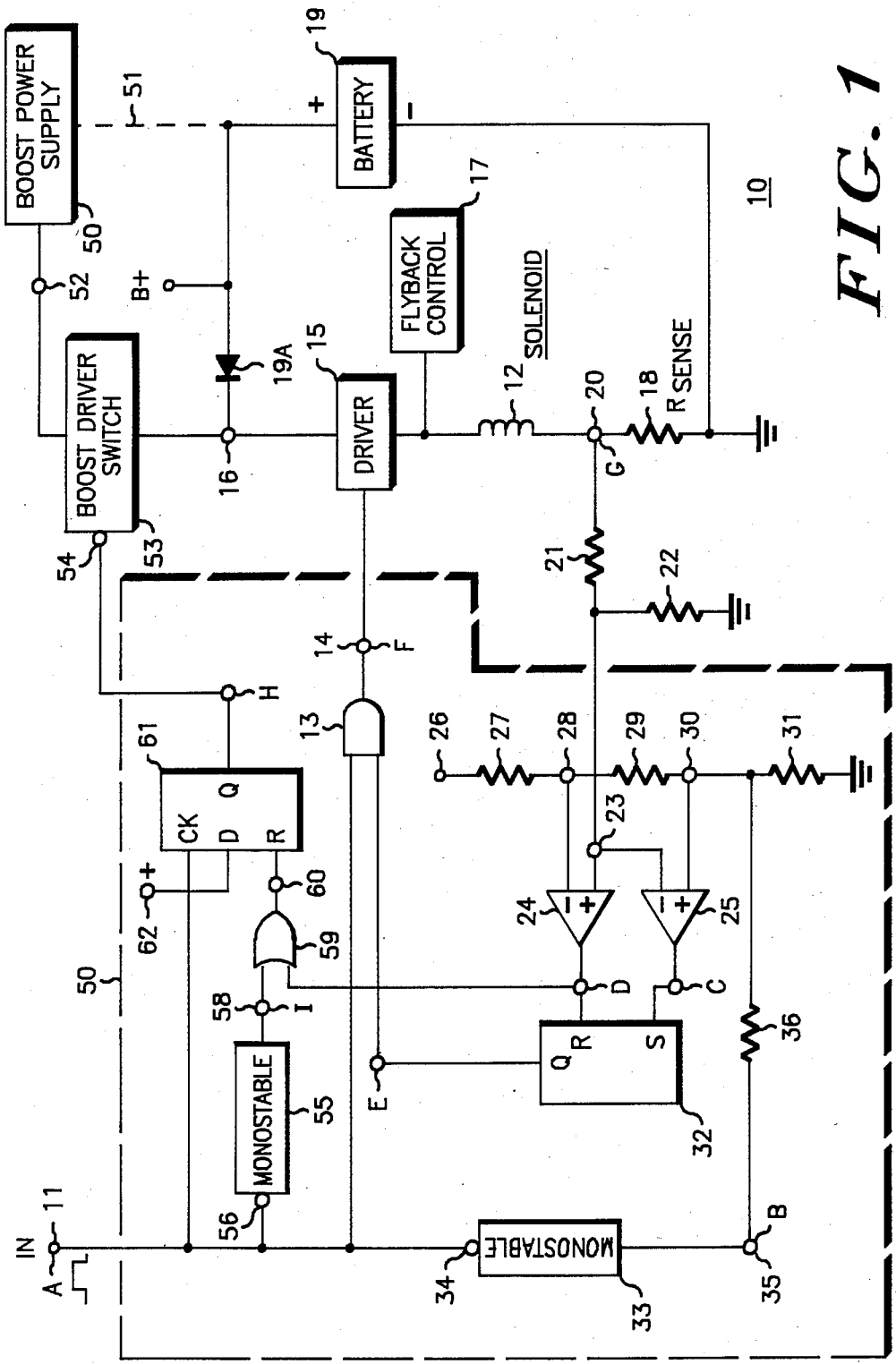
FIG. 1 is a schematic diagram of a dual limit solenoid current controller circuit constructed in accordance with the present invention.

Referring to FIG. 1, a dual limit solenoid current controller circuit 10 is illustrated. The circuit includes an input terminal 11 at which a control signal, comprising a fuel injector pulse, is received wherein actuation of a solenoid 12, illustrated in FIG. 1 by a solenoid inductance 12, is implemented in response to the control signal. Preferably, the solenoid comprises an engine fuel injector solenoid.

The terminal 11 is connected as an input to an effective AND gate 13 which provides an output at a terminal 14 that is coupled as an input to a solenoid driver stage 15 connected between a positive voltage power source terminal 16 and the solenoid inductor 12. A flyback control device 17 is also connected to the solenoid 12 so as to implement flyback voltage control for energy stored in the solenoid inductor. The solenoid 12 is connected through a current sensing resistor 18 to ground potential. A power source comprising a battery 19 has its positive voltage terminal connected to the anode of an isolation diode 19A and its negative voltage terminal connected to ground. The battery 19 and diode 19A provide a nominal battery voltage of about 14 volts at the power source terminal 16.

Essentially, signals at the terminal 14 switch the solenoid driver stage 15 on and off such that when the driver stage 15 is on, current can flow through the solenoid inductor 12 from the power source terminal 16, and when the driver stage 15 is off, current cannot effectively flow through the solenoid from the power source terminal. The operation of the flyback control device 17 to recirculate current produced by energy stored in the solenoid is well understood to those of skill in the art and, therefore, will not be further explained.

The connection between the solenoid 12 and the sensing resistor 18 is provided at a terminal 20 that is coupled through a calibration resistor divider network comprising resistors 21 and 22 to a terminal 23. The terminal 23 is directly connected to the noninverting input of a DC comparator 24 and to the inverting input of a DC comparator 25. The DC comparators 24 and 25 are substantially identical in construction. A resistor divider network is provided between a low voltage power supply terminal 26 and ground potential wherein a resistor 27 is connected between the terminal 26 and a terminal 28 corresponding to the inverting input of the comparator 24. A resistor 29 is connected between the terminal 28 and a terminal 30 corresponding to the noninverting input of the comparator 25. A resistor 31 is connected between the terminal 30 and ground potential. The resistor divider comprising the resistors 27, 29 and 31 will essentially selectively provide maximum and minimum first and second threshold levels to the comparators 24 and 25 in accordance with the present invention as will be subsequently discussed.

The output of the comparator 24 is provided at a terminal D and is connected to a reset terminal R of a set/reset flip flop circuit 32, and the output of the comparator 25 is provided at terminal C and is connected to a set terminal S of the flip flop. An output terminal Q of the flip flop 32 is connected as an input to the AND gate 13. A monostable multivibrator 33 has an input terminal 34 directly connected to the terminal 11 and provides an output signal at a terminal 35. The terminal 35 and the signal thereat are coupled through a scaling resistor 36 to the terminal 30. The operation of the above-noted circuit configuration will now be discussed in conjunction with the signal waveforms shown in FIG. 2 wherein the vertical axis of these waveforms represents magnitude and the horizontal axis is representative of time. The signal waveforms in graphs A-I in FIG. 2 correspond to the signals provided at terminals A-I in FIG. 1.

Figure 2:
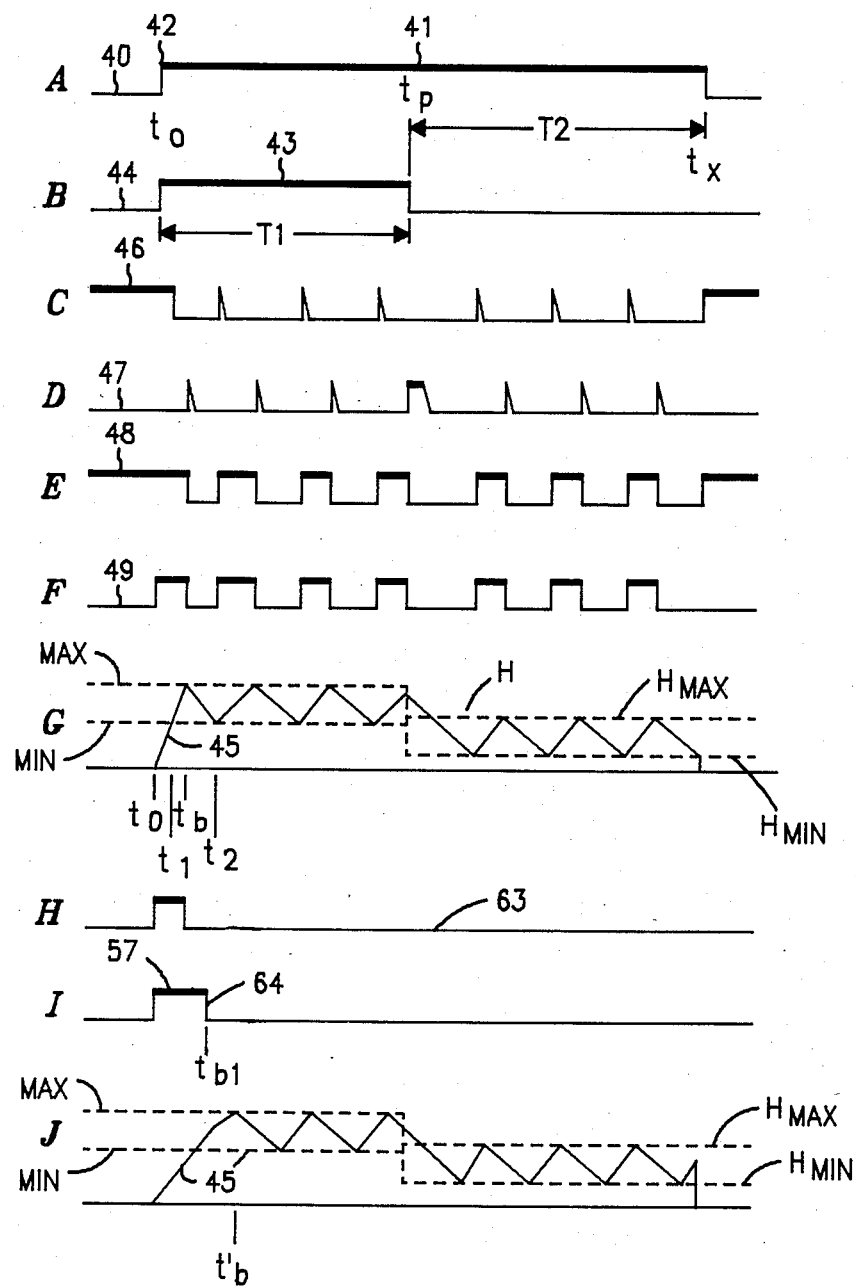
FIG. 2 is a series of graphs A through J which illustrate signal waveforms provided at various terminals of the circuit shown in FIG. 1.

Graph A in FIG. 2 represents a control signal 40 provided at the input terminal 11 of the system shown in FIG. 1. Prior to an initial time $t_0$, a low signal level is present which results in the driver stage 15 preventing current flow from the battery 19 through the solenoid 12. In other words, the driver stage 15 represents an open circuit so as to prevent solenoid current flow. At the time $t_0$, a positive pulse 41 of predetermined length commences for the signal 40 wherein during this pulse, actuation of the solenoid 12 is desired. The pulse 41 preferably comprises a fuel injection pulse. In response to a leading edge 42 of this positive pulse of the signal 40, the monostable multivibrator 33 produces an output pulse 43 of a signal 44 having a predetermined time duration T1, independent of solenoid current sensed by resistor 18, corresponding to a "pull-in" time period. During this pull-in time period, an effective relatively high current is allowed to flow in the solenoid 12 to insure rapid actuation of the solenoid. Subsequently during a hold period T2, a lower current level will effectively be provided for the solenoid 12 so as to maintain the solenoid in an actuated state. This is accomplished in the following manner.

Essentially, the monostable 33 produces the output pulse 43 which, via the scaling resistor 36, produces a voltage pulse at the terminal 30. The signal 44 is schematically represented by the graph B in FIG. 2. Graph G in FIG. 2 is representative of the voltage at the terminal 20 which essentially corresponds to a current sense signal 45. At the time $t_0$, there is no current flowing in the solenoid 12, and, therefore, the voltage at the terminal 20 representative of sensed solenoid current, which is sensed by the resistor 18, is 0. Since a low voltage is provided at the terminal 20 prior to $t_0$, this results in the comparator 25 producing a high output setting flip flop 32 since the voltage at the terminal 30 will exceed the current sense related signal provided at the terminal 23. The output of the comparator 25 corresponds to a signal 46 illustrated in graph C in FIG. 2. Since the voltage at the terminal 23 is low (zero) at the time $t_0$, this results in the comparator 24 providing a low output at this time to the reset terminal R of the flip flop 32. The output of the comparator 24 is illustrated in graph D of FIG. 2 as signal 47. The end result is that at the time $t_0$, the flip flop 32 will be set such that the signal at its output terminal Q will be high wherein this signal corresponds to the signal 48 illustrated in graph E in FIG. 2. Since the signal 48 provides one input to the AND gate 13, and the signal 40 at the terminal 11 provides the other input, this results in the output of the AND gate 13, at terminal 14, switching from low to high at the time $t_0$. The signal at the terminal 14 is illustrated in graph F of FIG. 2 as the signal 49. The end result is that a high signal is provided as an input to the driver stage 15 via the terminal 14. This results in effectively closing a switch in stage 15 which connects the power source terminal 16 to the solenoid 12 and results in the initiation of solenoid current such that the current sense signal 45 will begin to rise after $t_0$. As the current through the solenoid rises, the voltage at the terminal 23 will increase wherein this voltage varies in substantially the same manner as the signal 45 at the terminal 20.

During and throughout the pull-in period corresponding to the period T1, the output of the monostable multivibrator 33 results in predetermined fixed reference voltages being provided at the terminals 28 and 30 wherein these voltages comprise reference threshold voltages applied to the separate comparators 24 and 25. As the voltage at the terminal 20 increases, the signal at the terminal 23 will essentially pass the fixed reference voltage being maintained at the terminal 30, and this will result in the signal 46 at the set terminal S of the flip flop going low. This occurs at $t_1$. However, this has no effect on circuit operations since the output 48 of the flip flop 32 remains in a high state. This is readily visualized in graph G in FIG. 2 by the signal 45 exceeding a reference current level corresponding to an initial minimum level $I_{min}$.

Subsequently, the solenoid current represented by the signal 45 will continue to increase until an initial maximum reference level $I_{max}$ is achieved at a time $t_2$ at which time the comparator 24 will produce an output pulse since the voltage at the terminal 23 will now exceed the voltage at the reference terminal 28. In response to the output pulse produced by the comparator 24, the flip flop 32 will be reset such that its output 48 will be a low state, and this results in essentially opening the connection between the power source terminal 16 and the solenoid 12. At this time, the flyback control device 17 implements control of the current recirculation maintained by the solenoid inductance, and solenoid current begins to decrease as is generally illustrated by the reduction in the signal 45 shown in graph G. This reduction in solenoid current continues until such time $t_3$ as the voltage at the sense terminal 23 is such that the reference threshold voltage at the terminal 30 now exceeds the voltage at the terminal 23. At this time, the comparator 25 will produce a brief output pulse resulting in setting the flip flop 32 to a high state, and this results in closing the connection between the power source terminal and the solenoid so as to increase solenoid current. This type of operation continues cyclically until the end of the pull-in period T1 which occurs at a time $t_p$. Thus, during the pull-in period of time T1, the solenoid current will effectively cyclically vary between reference thresholds corresponding to the pull-in current reference levels $I_{max}$ and $I_{min}$ shown in graph G.

During the hold period time T2 which exists from the time $t_p$ to the end of the control pulse 41 of the signal 40, which terminates at a subsequent time $t_x$, the monostable 33 ceases to provide any voltage pulse to the terminal 30. This results in changing the fixed thresholds which are present at the terminals 28 and 30 of the resistor divider of the present circuit which divider comprises the resistors 27, 29 and 31. The effect of this is to implement holding maximum and holding minimum current thresholds $H_{max}$ and $H_{min}$ for the solenoid current wherein these levels are generally illustrated in graph G of FIG. 2. Thus during the holding period, again the solenoid current will vary cyclically due to the operation of the comparators 24 and 25, but now the maximum and minimum holding thresholds for solenoid current are lower than the corresponding maximum and minimum solenoid current threshold levels provided during the initial pull-in period. It should be noted that the maximum and minimum reference threshold levels for both the pull-in period and the hold period are provided at the terminals 28 and 30 wherein during the pull-in period higher fixed levels are provided due to the operation of the monostable multivibrator 33, whereas during the hold period lower fixed threshold levels are provided.

The above-described solenoid driver control circuit corresponds to the dual limit solenoid driver in the above-noted copending U.S. patent application, the specification of which is hereby incorporated by reference. The control circuit includes the control terminal 11 at which the control signal 40 is provided, as well as the current sensing resistor 18 that produces the sense signals at the terminals 20 and 23 that are representative of current flowing through the solenoid 12. The solenoid driver stage 15 is essentially operable in first and second states such that in on and off conditions it will selectively connect and disconnect the power source terminal 16 and the solenoid 12. Two separate threshold comparators 24 and 25 are provided with each of these comparing at least one received fixed reference threshold input signal, provided by the voltage divider comprising the resistors 27, 29 and 31, with a current sense signal representative of the voltage at the terminal 23. The outputs of each of these comparators are coupled through the flip flop 32 so as to provide control of the solenoid driver stage 15.

The present invention differs from the solenoid driver disclosed in the above-noted copending U.S. patent application, in that the present invention contemplates the selective application of a boost voltage, preferably about 90 volts, to the power source terminal 16. This boost voltage, which is substantially higher than the nominal 14 volt battery voltage provided by the battery 19, is applied during the initial pull-in period so as to increase the rise time for solenoid current and thereby more rapidly implement actuation of the solenoid 12. In the present invention, the substantially higher boost voltage is not applied throughout the pull-in period, but is applied only until either the maximum current limit $I_{max}$ is achieved during the pull-in period, or until a predetermined time has elapsed from initiation of the pull-in period, wherein the elapsing of this predetermined time, without achievement of the current limit $I_{max}$, is indicative of a fault which may be correctable by terminating boost voltage application prior to termination of the pull-in period. The above major features of the present invention are implemented by the following components illustrated in FIG. 1.

Referring to FIG. 1, a high voltage auxiliary boost power supply 50 is illustrated which may have an operative connection 51 to the battery 19. The boost power supply 50 essentially provides a relatively high positive voltage, such as 90 volts, at an output terminal 52. The boost power supply 50 can comprise chopper or transformer circuits which receive power from the battery 19, that provides an output voltage of approximately 14 volts, and step up this voltage to provide the high voltage signal at the terminal 52. Terminal 52 is connected as an input to a boost driver switch 53 which has a series output connected to the terminal 16 and receives control signals at a control terminal 54. The boost driver switch 53 essentially operates identically to the driver 15 in that it selectively provides either an open or short circuit connection between its input and output terminals in accordance with the signal at the control terminal 54. In this manner, the boost driver switch 53 selectively provides the 90 volt boost voltage to the power source terminal 16 in accordance with the control signals at the terminal 54. These control signals are provided by the following recited structure.

A monostable multivibrator 55 has a control input terminal 56 directly connected to the terminal 11 and provides, in response to the leading edge 42 of the signal 40, a timing pulse 57 of predetermined duration at a terminal 58 wherein the pulse 57 is shown in graph I in FIG. 2. The pulse 57 commences at the time $t_0$ and terminates at a subsequent predetermined time $t_{b1}$ which is independent of sensed solenoid current. The terminal 58 is provided as one input to an OR gate 59 which receives another input by virtue of a direct connection to the terminal D corresponding to the output of the comparator 24. The OR gate 59 provides an output at a terminal 60 which is coupled to the reset terminal R of a D-type flip flop circuit 61. The flip flop 61 has a data terminal D connected to a constant positive voltage terminal 62, and a clock terminal CK of the flip flop 61 is directly connected to the input terminal 11. An output terminal Q of the flip flop 61 is directly connected to a terminal H which corresponds to the control terminal 54 of the boost driver switch 53. The operation of the aforementioned components is as follows.

In response to the leading edge 42 of the fuel injector pulse 41, this rising edge transition at $t_0$ causes the flip flop 61 to sample the data at its terminal D, which is held constantly high, and, therefore, sets the output of the flip flop, corresponding to the signal at the terminal 54, to a high state. With a high state at the terminal 54, the boost driver switch 53 implements a short circuit between terminals 52 and 16, and a 90 volt boost supply voltage is applied to the power source terminal 16. At the same time, time $t_0$, the signal at the terminal 14 causes the driver 15 to implement a short circuit thereby causing causing the application of the 90 volt boost voltage across the solenoid 12. This results in increasing the rise time for solenoid current above what it would have been if just the 14 volt battery voltage of battery 19 had been applied to the power source terminal 16. The diode 19A prevents the high voltage from the boost power supply from causing current to flow into the positive battery terminal.

With a higher voltage at the power source terminal 16, solenoid current rises more rapidly and the pull-in maximum solenoid current limit $I_{max}$ is achieved at a subsequent time $t_b$ which is typically 200 microseconds after $t_0$. At the time $t_b$, the signal 49 at the terminal 14 will open the driver 15 as was previously noted. However, at this same time, in accordance with the present invention, the trailing edge of the pulse of the signal 47 at the terminal D will result in resetting the flip flop 61. This results in effectively resetting the flip flop to a low state for the remaining portion of the pull-in cycle. This disconnects the boost power supply 50 from the power source terminal 16.

The output of the flip flop 61, which corresponds to the control signal at the terminal 54, is illustrated in graph H in FIG. 2 and comprises a signal 63 which typically comprises a pulse that exists between the times $t_0$ and $t_b$. It should be noted that the maximum pull-in current limit is achieved at the time $t_b$ during the pull-in time $T_1$. Once the flip flop 61 has received a reset pulse at its terminal R, the flip flop will remain reset until the next rising edge of a control signal at the terminal 11. Thus, for the remaining pull-in time and for the subsequent hold period $T_2$, the signal 63 at the terminal 54 will remain low. This results in the boost driver switch 53 providing an open circuit such that the 90 volt boost voltage is now disconnected from the power source terminal 16, and the battery voltage of 14 volts is now coupled to the power source terminal through the diode 19A. Thus, in essence, the present invention has provided for applying the 90 volt boost voltage to the power source terminal 16 during the pull-in period $T_1$ until the pull-in maximum current limit occurs, and then the nominal battery voltage of 14 volts is provided thereafter during a remaining portion of the pull-in time and during the subsequent hold time.

In the event that the solenoid current, even with application of boost voltage, does not achieve the pull-in maximum current limit $I_{max}$ within the time $t_0$ to $t_{b1}$, set by monostable 55, a trailing edge 64 of the monostable pulse 57 at the terminal 58 will result in resetting the flip flop 61 such that a low output state is provided at the control terminal 54. This means that if there is a defect such that the pull-in maximum current $I_{max}$ is not achieved within a predetermined time period, independent of solenoid current, then the present invention concludes that a fault exists and disconnects the boost voltage from the power source terminal for the remaining portion of the pull-in period. This results in providing additional time for recovery of the boost power supply. When the boost voltage is not applied to the power source terminal 16, the boost power supply 50 will now have additional time to generate its high voltage signal at the terminal 52 prior to the next connection of boost voltage to the power source terminal 16.

Graph J in FIG. 2 illustrates the shape of a signal 45' at the terminal 20, representative of solenoid current, in the event that a fault has occurred such that the pull-in maximum current limit $I_{max}$ is not achieved prior to the time $t_{b1}$. In this case the pulse of the signal 63 is extended to $t_{b1}$, and at the time $t_{b1}$, application of the high boost voltage to the power source terminal 16 is terminated resulting in a somewhat slower rise for solenoid current. Graph J indicates that at some subsequent time $t'_b$, prior to the expiration of the pull-in time $T_1$, the pull-in maximum current limit is achieved. At this time, cyclic operation of the driver circuit between the pull-in maximum and minimum current limits is commenced until the end of the pull-in period at the time $t_p$. After this time, cyclic implementation of the hold current limits $H_{max}$ and $H_{min}$ is implemented. It should be noted that typically with the application of the high boost voltage, the pull-in maximum current limit will be achieved in about 200 microseconds after the time $t_0$. Typically, the monostable 55 is designed to implement the pulse 57 having a duration of 400 microseconds after $t_0$. Therefore, if it takes more than twice as long as the typical time for the pull-in current maximum to occur, then a fault condition may exist, and at that time the boost voltage is disconnected from the power source terminal 16.

The manner in which the present invention selectively connects and terminates boost voltage for solenoid actuation differs substantially from the prior technique of applying the boost voltage throughout the pull-in time period during which a pull-in maximum current limit is utilized. According to the prior art technique, boost voltage is applied for the entire pull-in period. The present invention clearly contemplates only applying boost voltage until either the pull-in maximum current limit has been initially achieved, followed by subsequent cycling during the pull-in period between the pull-in maximum and minimum limits, or until a predetermined period of time, independent of solenoid current, has elapsed since the initiation of the pull-in period. In each case, the present invention contemplates the pull-in period as existing beyond the termination of the boost voltage as applied to the power source terminal 16. In this respect, the present invention allows more time for recovery of the boost power supply as well as minimizing the amount of time that the driver 15 and solenoid 12 must be subjected to the substantially higher boost voltage. For these reasons, the circuit of the present invention has superior performance characteristics over the prior solenoid drivers which utilize selective application of boost power supply voltage.

Figure 3:
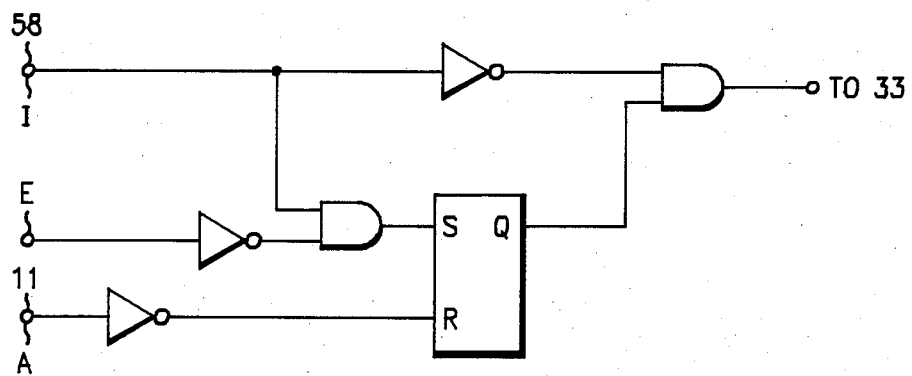
FIG. 3 is a schematic diagram of additional circuitry which can be added to the FIG. 1 circuit.

It should be noted that if any default condition is detected such that the trailing edge 64 of the pulse 57 results in disconnecting the boost voltage prior to the first occurrence of the pull-in current limit $I_{max}$, this fault information may be utilized by additional circuitry. This additional circuitry (shown by example in FIG. 3) is preferably used to effectively extend the pull-in time by modification of the output signal at the terminal 35 which defines the pull-in period of time. This might result in correcting faulty operation by providing sufficient pull-in time to achieve actuation of the solenoid by maintaining a high maximum solenoid current limit for the longer pull-in duration. The modification of the output at terminal 35 can be implemented either by extending the output pulse of the monostable 33, or by triggering an additional monostable whose output is added to the terminal 35. Thus the present embodiment contemplates the use of conventional logic circuits, such as the circuitry in FIG. 3, to determine if, after each rising edge 42, the trailing edge 64 occurs before the first occurrence of the pull-in current limit $I_{max}$. If so, then this indicates a fault and a signal is provided so as to effectively extend the predetermined pull-in period $T_1$. This feature provides an effective extension of the pull-in period $T_1$ for any fault, not just a failure of the boost power supply, which results in failing to achieve the pull-in current limit Imax between $t_0$ and $t_{b1}$.

While specific embodiments of the present invention have been shown and described, further modifications and improvements will occur to those skilled in the art. One such modification could comprise connecting the resistor 36 between terminals 35 and 28, instead of terminals 35 and 30. All such modifications which retain the basic underlying principles disclosed and claimed herein are within the scope of this invention.

We claim:
1. A solenoid driver control circuit comprising:
   a control signal input terminal for receiving a control signal;
   current sense means for providing a current sense signal indicative of current flowing through a solenoid;
   solenoid driver means having a first operable state such that current can flow through said solenoid from a power source terminal and a second operable state such that current effectively cannot flow from said power source terminal through said solenoid;
   threshold comparator means for comparing at least one received reference threshold input signal with said current sense signal and for providing an output signal in response thereto to control said solenoid driver means and implement at least maximum limits for said solenoid current;

pull-in current means for responding to said control signal by initially providing, for an initial pull-in period of time, at least a predetermined maximum first reference threshold to said comparator means corresponding to a maximum current limit for said solenoid current during said pull-in period of time;

holding current means for providing, for a hold time after said pull-in period of time, at least a predetermined maximum second reference threshold to said comparator means corresponding to a maximum current limit for said solenoid current during said hold time, said hold maximum current limit being lower than said pull-in maximum current limit;

battery circuit means for connection between a battery and said power source terminal to selectively provide a nominal voltage at said power source terminal; and boost means coupled to said power source terminal to selectively provide a boost voltage substantially in excess of said nominal voltage at said power source terminal;

wherein the improvement comprises boost control means coupled to said boost means and said threshold comparator means for providing said boost voltage to said power source terminal during said pull-in period until said pull-in maximum current limit occurs, said nominal voltage then being provided to said power source terminal during a remaining portion of said pull-in time.

2. A solenoid driver control circuit according to claim 1 wherein said nominal voltage is provided by said battery circuit means at said power source terminal during said hold time.

3. A solenoid driver control circuit according to claim 1 wherein said boost control means includes additional means for, in response to said control signal, terminating providing said boost voltage at said power source terminal prior to termination of said pull-in time and at a predetermined time after said boost voltage is applied to said power source terminal, said additional means being effective if said pull-in maximum current limit for solenoid current has not previously occurred within this predetermined time.

4. A solenoid driver control circuit according to claim 3 wherein said pull-in current means includes a monstable means for providing, in response to said control signal, a time period independent of sensed solenoid current as said pull-in period of time.

5. A solenoid driver control circuit according to claim 4 wherein said comparator means includes at least two separate comparators having outputs coupled to said solenoid driver means, one comparator implementing an associated maximum solenoid current limit, and one comparator implementing a minimum solenoid current limit, said solenoid driver means causing said solenoid current to be cycled between said maximum and minimum current limits determined by said separate comparators during at least one of said pull-in and hold time periods.

6. A solenoid driver control circuit according to claim 5 wherein said solenoid driver causes said solenoid current to vary cyclically between maximum and minimum current limits during said pull-in time and wherein said solenoid driver means causes said solenoid current to vary cyclically between different maximum and minimum current limits during said hold time, said maximum and minimum current limits being implemented by the output of said two separate comparators and said solenoid driver means.

7. A solenoid driver control circuit according to claim 6 wherein said maximum current limit during said pull-in time exceeds said maximum current limit during said hold time and wherein said minimum current limit during said pull-in time exceeds said minimum current limit during said hold time.

8. A solenoid driver control circuit according to claim 1 wherein said pull-in current means includes a monostable means for providing, in response to said control signal, a time period independent of sensed solenoid current as said pull-in period of time.

9. A solenoid driver control circuit according to claim 1 wherein said comparator means includes at least two separate comparators having outputs coupled to said solenoid driver means, one comparator implementing an associated maximum solenoid current limit, and one comparator implementing a minimum solenoid current limit, said solenoid driver means causing said solenoid current to be cycled between said maximum and minimum current limits determined by said separate comparators during at least one of said pull-in and hold time periods.

10. A solenoid driver control circuit according to claim 1 wherein said solenoid driver means causes said solenoid current to vary cyclically between maximum and minimum current limits during said pull-in time and wherein said solenoid driver means causes said solenoid current to vary cyclically between different maximum and minimum current limits during said hold time, said maximum and minimum current limits being implemented by the output of said comparator means and said solenoid driver means.

11. A solenoid driver control circuit comprising:
a control signal input terminal for receiving a control signal;
current sense means for providing a current sense signal indicative of current flowing through a solenoid;
solenoid driver means having a first operable state such that current can flow through said solenoid from a power source terminal and a second operable state lo such that current effectively cannot flow from said power source terminal through said solenoid;
threshold comparator means for comparing at least one received reference threshold input signal with said current sense signal and for providing an output signal in response thereto to control said solenoid driver means and implement at least maximum limits for said solenoid current;
pull-in current means for responding to said control signal by initially providing, for an initial pull-in period of time, at least a predetermined maximum first reference threshold to said comparator means corresponding to a maximum current limit for said solenoid current during said pull-in period of time;
holding current means for providing, for a hold time after said pull-in period of time, at least a predetermined maximum second reference threshold to said comparator means corresponding to a maximum current limit for said solenoid current during said hold time, said hold maximum current limit being lower than said pull-in maximum current limit;
battery circuit means for connection between a battery and said power source terminal to selectively provide a nominal voltage at said power source terminal; and boost means coupled to said power source terminal to selectively provide a boost voltage substantially in excess of said nominal voltage at said power source terminal;

wherein the improvement comprises boost control means coupled to said boost means and said control terminal for providing, in response to said control signal, said boost voltage to said power source terminal during said pull-in period and for terminating providing said boost voltage at said power source terminal prior to termination of said pull-in time and at a predetermined time after boost voltage is applied to said power source terminal, said nominal voltage then being provided to said power source terminal during a remaining portion of said pull-in time.

12. A solenoid driver control circuit according to claim 11 wherein said nominal voltage is provided by said battery circuit means at said power source terminal during said hold time.

13. A solenoid driver control circuit according to claim 12 wherein said pull-in current means includes a monostable means for providing, in response to said control signal, a time period independent of sensed solenoid current as said pull-in period of time.

14. A solenoid driver control circuit according to claim 13 wherein said boost control means comprises an additional monostable means for providing, in response to said control signal, a signal, independent of sensed solenoid current, which defines said predetermined time for terminating said boost voltage during said pull-in time.

15. A solenoid driver control circuit according to claim 14 wherein said comparator means includes at least two separate comparators having outputs coupled to said solenoid driver means, one comparator implementing an associated maximum solenoid current limit, and one comparator implementing a minimum solenoid current limit, said solenoid driver means causing said solenoid current to be cycled between said maximum and minimum current limits determined by said separate comparators during at least one of said pull-in and hold time periods.

16. A solenoid driver control circuit according to claim 15 wherein said solenoid driver means causes said solenoid current to vary cyclically between maximum and minimum current limits during said pull-in time and wherein said solenoid driver means causes said solenoid current to vary cyclically between different maximum and minimum current limits during said hold time, said maximum and minimum current limits being implemented by the output of said two separate comparators and said solenoid driver means.

17. A solenoid driver control circuit comprising:
a control signal input terminal for receiving a control signal;
current sense means for providing a current sense signal indicative of current flowing through a solenoid;
solenoid driver means having a first operable state such that current can flow through said solenoid from a power source terminal at which voltage is applied and a second operable state such that current effectively cannot flow from said power source terminal through said solenoid;
threshold comparator means for comparing at least one received reference threshold input signal with said current sense signal and for providing an output signal in response thereto to control said solenoid driver means and implement at least maximum limits for said solenoid current;
pull-in current means for responding to said control signal by initially providing, for an initial predetermined pull-in period of time, at least a predetermined maximum first reference threshold to said comparator means corresponding to a maximum current limit for said solenoid current during said pull-in period of time; and
holding current means for providing, for a hold time after said pull-in period of time, at least a predetermined maximum second reference threshold to said comparator means corresponding to a maximum current limit for said solenoid current during said hold time, said hold maximum current limit being lower than said pull-in maximum current limit; and
wherein the improvement comprises control means coupled to said threshold comparator means for effectively extending said initial predetermined pull-in period of time in response to detecting failure of said sensed solenoid current to achieve said pull-in maximum current limit within a predetermined time after initiation of solenoid current flow during said pull-in period.

18. A solenoid driver control circuit according to claim 1 wherein said initial pull-in period of time is predetermined, and which includes control means coupled to said threshold comparator means for effectively extending said initial predetermined pull-in period of time in response to detecting failure of said sensed solenoid current to achieve said pull-in maximum current limit within a predetermined time after initiation of solenoid current flow during said pull-in period.

19. A solenoid driver control circuit according to claim 3 wherein said initial pull-in period of time is predetermined, and which includes control means coupled to said threshold comparator means for effectively extending said initial predetermined pull-in period of time in response to detecting failure of said sensed solenoid current to achieve said pull-in maximum current limit within a predetermined time after initiation of solenoid current flow during said pull-in period.

20. A solenoid driver control circuit according to claim 11 wherein said initial pull-in period of time is predetermined, and which includes control means coupled to said threshold comparator means for effectively extending said initial predetermined pull-in period of time in response to detecting failure of said sensed solenoid current to achieve said pull-in maximum current limit within a predetermined time after initiation of solenoid current flow during said pull-in period.

21. A solenoid driver control circuit according to claim 11 wherein said predetermined time for terminating said boost voltage during said pull-in time is independent of sensed solenoid current.

* * * * *